United States Patent
Tripathi et al.

(10) Patent No.: US 7,446,592 B2
(45) Date of Patent: Nov. 4, 2008

(54) PVT VARIATION DETECTION AND COMPENSATION CIRCUIT

(75) Inventors: Divya Tripathi, Bhopal (IN); Siddhartha Gk, Puram (IN); Qadeer A. Khan, New Delhi (IN); Kulbhushan Misri, Haryana (IN); Sanjay K Wadhwa, Saharanpur (IN)

(73) Assignee: Freescale Semiconductor, Inc., Austin, TX (US)

( * ) Notice: Subject to any disclaimer, the term of this patent is extended or adjusted under 35 U.S.C. 154(b) by 163 days.

(21) Appl. No.: 11/490,440

(22) Filed: Jul. 20, 2006

(65) Prior Publication Data

US 2007/0018713 A1   Jan. 25, 2007

(30) Foreign Application Priority Data

Jul. 22, 2005   (IN) .................. 1928/DEL/2005

(51) Int. Cl.
    *H01L 35/00*    (2006.01)
    *H01L 37/00*    (2006.01)
    *H03K 3/42*    (2006.01)
    *H03K 17/78*    (2006.01)

(52) U.S. Cl. ........................... 327/513; 327/512
(58) Field of Classification Search .............. 327/512, 327/513
See application file for complete search history.

(56) References Cited

U.S. PATENT DOCUMENTS

| | | | |
|---|---|---|---|
| 5,498,977 | A | 3/1996 | Pickup |
| 5,892,409 | A | 4/1999 | Boerstler |
| 6,218,886 | B1 | 4/2001 | Balisteri et al. |
| 6,417,727 | B1 | 7/2002 | Davis |
| 6,486,699 | B1 | 11/2002 | Friebe et al. |
| 6,504,420 | B1 | 1/2003 | Vorenkamp et al. |
| 6,653,890 | B2 | 11/2003 | Ono et al. |
| 6,822,504 | B2 * | 11/2004 | Morikawa ............... 327/513 |
| 6,844,755 | B2 | 1/2005 | Ajit |
| 2005/0134364 | A1 * | 6/2005 | Bhattacharya et al. ...... 327/543 |

* cited by examiner

*Primary Examiner*—Tuan T. Lam
*Assistant Examiner*—Daniel Rojas
(74) *Attorney, Agent, or Firm*—Charles Bergere

(57) ABSTRACT

A compensation circuit and a method for detecting and compensating for process, voltage, and temperature (PVT) variations in an integrated circuit. The integrated circuit includes plural logic modules that include PMOS transistors and NMOS transistors. The compensation circuit includes first and second functional modules, which generate first and second calibration signals. The first and the second calibration signals are used to compensate for the PVT variations in PMOS and NMOS transistors.

16 Claims, 6 Drawing Sheets

PVT VARIATION DETECTION AND COMPENSATION CIRCUIT

BACKGROUND OF THE INVENTION

The present invention relates generally to the field of integrated circuits (ICs) and in particular, to process, voltage, and temperature (PVT) variations in ICs.

PVT variations are one of the critical factors that hamper the performance of the ICs. For example, PVT variations can result in a change in setup and hold times of synchronous circuits. Different components of a synchronous circuit are driven by a common system clock. Therefore, a change in the setup or hold times corresponding to any one component can result in erroneous circuit output. PVT variations can also result in fast switching of signals, which can cause electromagnetic interference (EMI). Further, PVT variations may cause current leakage.

One technique for reducing PVT variations in a circuit is based on sensing variations in the operation of the circuit, and taking appropriate action to reduce these variations. For example, if a variation in the signal delay is identified in the circuit, then the input signal is delayed to compensate for the variation. In other cases, delay variations in the circuit are monitored. Bias voltages of P-metal oxide semiconductor (PMOS) and N-metal oxide semiconductor (NMOS) transistors of the circuit are then changed, depending on the delay variations.

Some of the techniques mentioned above provide the same compensation for PVT variations to both the PMOS and the NMOS transistors. However, PVT variations associated with the PMOS and the NMOS transistors are different. Therefore, the techniques do not compensate for PVT variations sufficiently. Further, a memory is required to compensate for voltage variations. Finally, these techniques involve additional process steps, which are complex in nature.

BRIEF DESCRIPTION OF THE DRAWINGS

The following detailed description of preferred embodiments of the present invention will be better understood when read in conjunction with the appended drawings. The present invention is illustrated by way of example and not limited by the accompanying figures, in which like references indicate similar elements.

DETAILED DESCRIPTION OF THE PRESENT INVENTION

Figure 1:
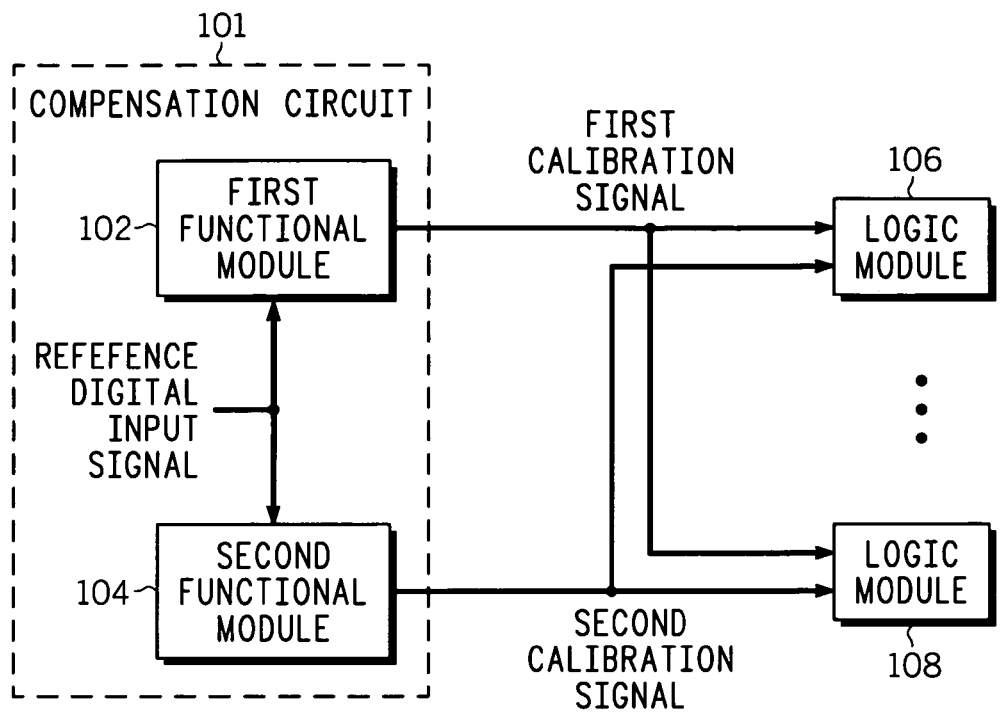
FIG. 1 is a schematic block diagram of shows a compensation circuit in accordance with an embodiment of the present invention.

The detailed description in connection with the appended drawings is intended as a description of the presently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

The present invention provides a compensation circuit for compensating for PVT variations in an integrated circuit. The integrated circuit includes a plurality of logic modules. The plurality of logic modules includes a plurality of PMOS transistors, and a plurality of NMOS transistors. The compensation circuit includes a first functional module, and a second functional module. The first functional module includes a set of PMOS transistors to generate a first calibration signal. The first calibration signal is used to compensate for the PVT variations in the plurality of PMOS transistors. The second functional module includes a set of NMOS transistors to generate a second calibration signal. The second calibration signal is used to compensate for the PVT variations in the plurality of NMOS transistors.

In another embodiment of the present invention, the present invention provides a compensation circuit for compensating for PVT variations in an integrated circuit having a plurality of logic modules. The plurality of logic modules includes a plurality of PMOS transistors, and a plurality of NMOS transistors. The compensation circuit includes a first frequency generator, a first counter, a second frequency generator, and a second counter. The first frequency generator includes a set of PMOS transistors to generate a first digital signal. The first counter is coupled to the first frequency generator, and generates a first calibration signal based on the first digital signal. The first calibration signal is used to compensate for the PVT variations in the plurality of PMOS transistors. The second frequency generator includes a set of NMOS transistors to generate a second digital signal. The second counter is coupled to the second frequency generator, and generates a second calibration signal based on the second digital signal. The second calibration signal is used to compensate for the PVT variations in the plurality of NMOS transistors.

In another embodiment of the present invention, a method for compensating for PVT variations in an integrated circuit is provided. The integrated circuit includes a plurality of logic modules. The plurality of logic modules includes a plurality of PMOS transistors, and a plurality of NMOS transistors. The method includes generating a first calibration signal, generating a second calibration signal, and compensating for the PVT variations in the plurality of logic modules. The first calibration signal is generated by using a set of PMOS transistors. The second calibration signal is generated by using a set of NMOS transistors. The first calibration signal is provided to the plurality of PMOS transistors. The second calibration signal is provided to the plurality of NMOS transistors.

In an embodiment of the present invention, the compensation circuit is implemented in an integrated circuit (IC). The compensation circuit is suitable for detecting process corners at which the IC is fabricated. The compensation circuit also compensates for PVT variations at skewed corners, that is, when NMOS transistors and PMOS transistors of the IC are fabricated at different process corners. The PVT variations in the PMOS and the NMOS transistors are compensated for separately. The compensation circuit compensates for the variations in real-time. Memory is not required for the compensation. Further, the compensation circuit can be fabricated using any standard technology, such as complementary metal oxide semiconductor (CMOS) technology.

Referring now to FIG. 1, a compensation circuit 101, in accordance with an embodiment of the present invention is shown. The compensation circuit 101 includes a first functional module 102 and a second functional module 104. The compensation circuit 101 compensates for the PVT variations in logic modules 106 and 108. The first functional module 102 generates a first calibration signal using a reference digital input signal. The second functional module 104 generates a second calibration signal using the reference digital input signal. The first and second calibration signals are used to compensate for the PVT variations in the logic modules 106 and 108. For this purpose, the logic module 106 receives the first calibration signal from the first functional module 102 and the second calibration signal from the second functional module 104. Similarly, the logic module 108 receives the first calibration signal from the first functional module 102 and the second calibration signal from the second functional module 104.

For the sake of simplicity, only two logic modules are shown in FIG. 1. The number of logic modules may be greater depending on the performance requirements of the IC. In general, the logic modules are circuits that need to be compensated for the PVT variations. Exemplary logic modules include, but are not limited to, devices such as I/O drivers, ring oscillators, delay lines, universal serial bus transmitters, serial advanced technology attachment transmitters, and low voltage differential signaling transmitters.

Figure 2:
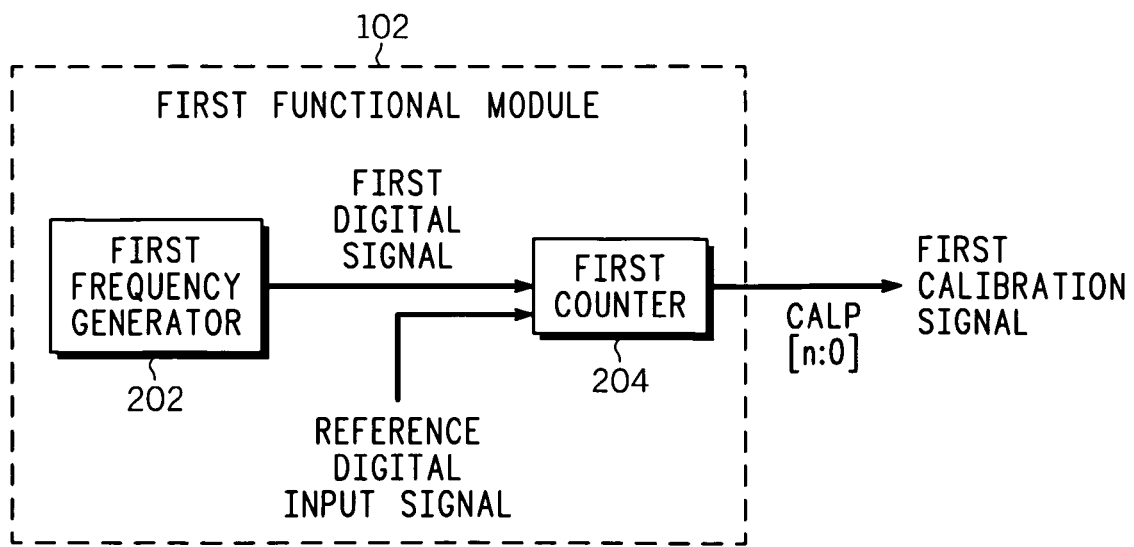
FIG. 2 is a schematic block diagram of a first functional module in accordance with an embodiment of the present invention.

FIG. 2 is a schematic block diagram of the first functional module 102 in accordance with an embodiment of the present invention. The first functional module 102 includes a first frequency generator 202 coupled to a first counter 204. The first frequency generator 202 generates the first digital signal.

Figure 3:
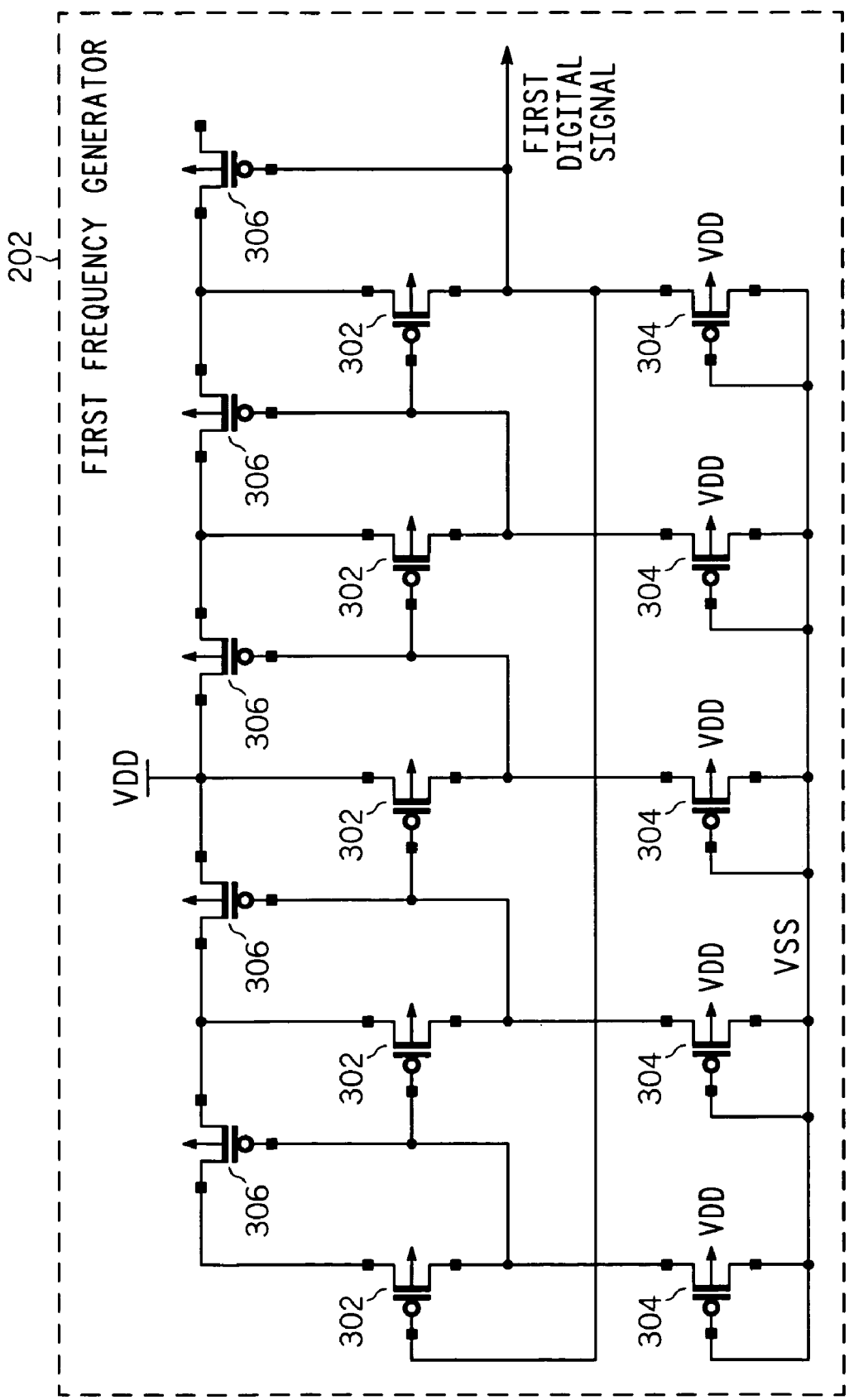
FIG. 3 is a circuit diagram of a first frequency generator in accordance with an exemplary embodiment of the present invention.

In an exemplary embodiment of the present invention, the first frequency generator 202 is a PMOS ring oscillator. FIG. 3 is a circuit diagram of the first frequency generator 202 in accordance with an exemplary embodiment of the present invention. The first frequency generator 202 includes PMOS transistors 302, PMOS transistors 304, and PMOS transistors 306. The PMOS transistors 306 serve as loads. Sources of the PMOS transistors 302 are connected to a voltage 'vdd'. Drains of the PMOS transistors 302 are connected to the corresponding sources of the PMOS transistors 304, as shown in FIG. 3. The drains of the PMOS transistors 304 are connected to a voltage 'vss'. This arrangement forms a series of inverters, which are connected through the loads to form the PMOS ring oscillator.

The PMOS transistors 302, 304, and 306 are compensatory in nature. That is, the PMOS transistors 302, 304 and 306 are used to compensate for the PVT variations in the logic modules 106 and 108. The PMOS ring oscillator generates the first digital signal. The first digital signal depends on the PVT variations in the PMOS transistors 302, 304, and 306.

Referring again to FIG. 2, the first counter 204 receives the first digital signal and the reference digital input signal as inputs, and generates the first calibration signal as an output. The first counter 204 counts the number of pulses of the first digital signal in a clock cycle of the reference digital input signal. An exemplary frequency of the reference digital input signal is about 13 MHz and the first digital signal is about 400 MHz. The count is output as the first calibration signal denoted by calp[n:0]. The first calibration signal includes bits calp[0] to calp[n], where, the number of bits generated by the counter is n+1, where n is an integer. In an exemplary embodiment of the present invention, the first counter 204 generates five bits corresponding to the count at an instant of time. The first calibration signal is provided to the logic modules 106 and 108 to compensate for the PVT variations.

Figure 4:
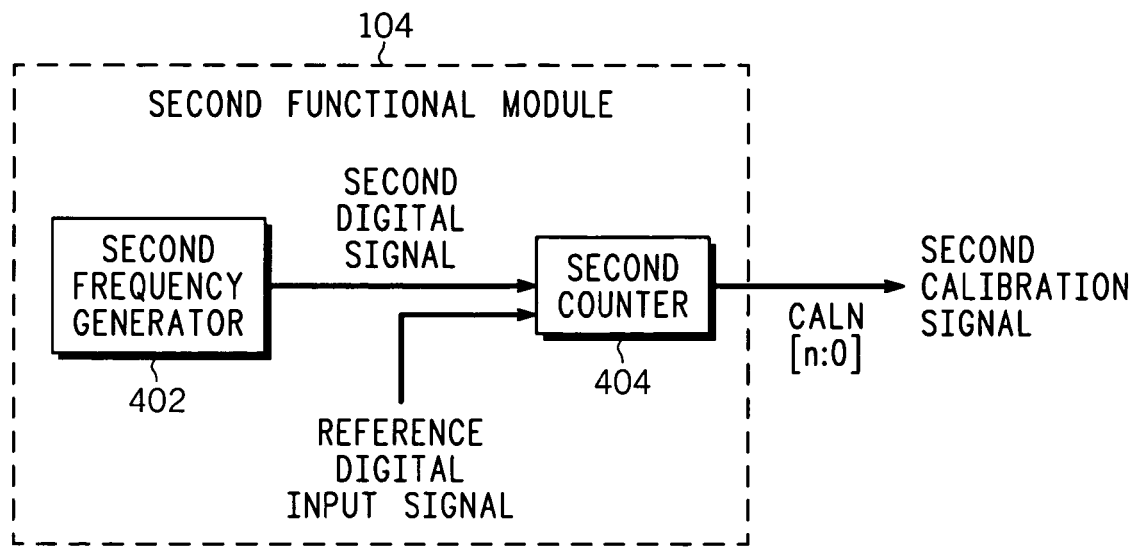
FIG. 4 is a schematic block diagram of a second functional module in accordance with an embodiment of the present invention.

FIG. 4 is a schematic block diagram of the second functional module 104 in accordance with an embodiment of the present invention. The second functional module 104 includes a second frequency generator 402 coupled to a second counter 404. The second frequency generator 402 generates a second digital signal.

Figure 5:
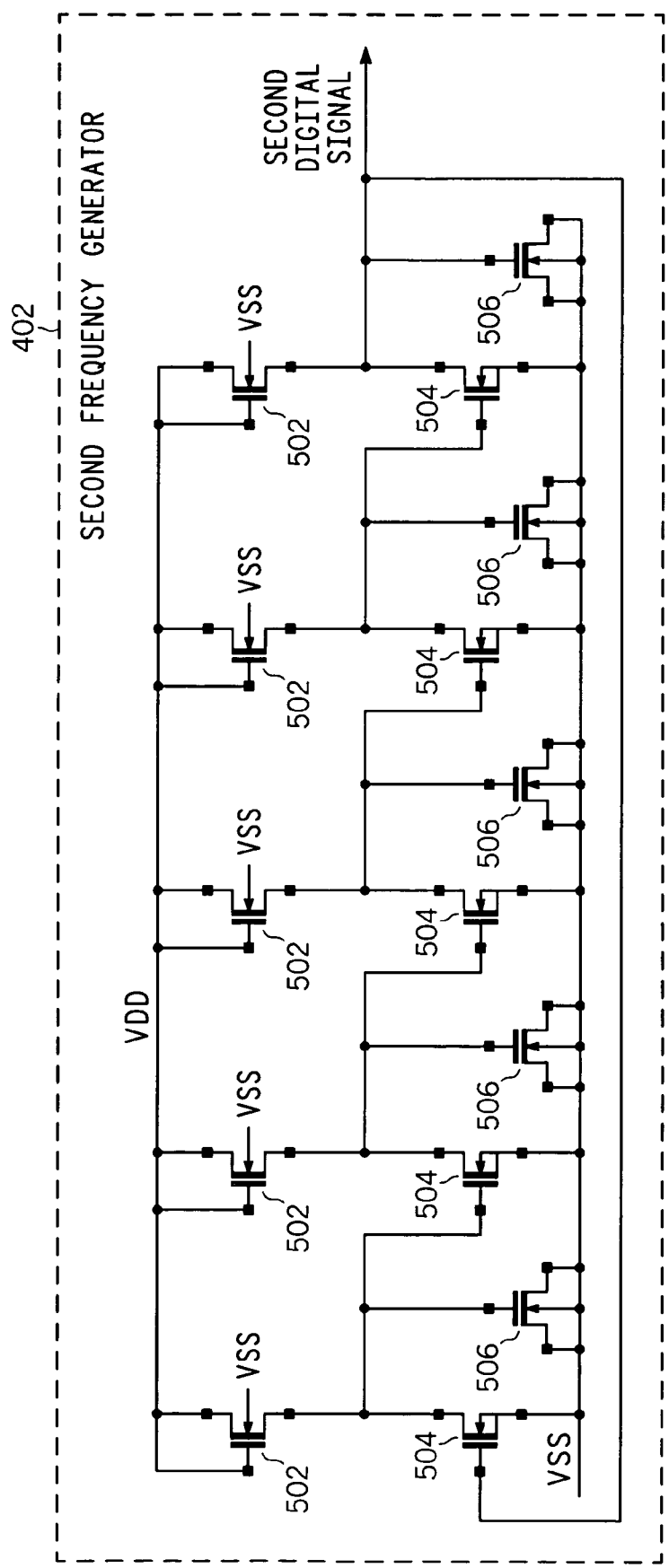
FIG. 5 is a circuit diagram of a second frequency generator in accordance with an exemplary embodiment of the present invention.

In an exemplary embodiment of the present invention, the second frequency generator 402 is an NMOS ring oscillator. FIG. 5 is a circuit diagram of the second frequency generator 402 in accordance with the exemplary embodiment of the present invention. The second frequency generator 402 includes NMOS transistors 502, NMOS transistors 504, and NMOS transistors 506. The NMOS transistors 506 serve as loads. The gates and drains of the NMOS transistors 502 are connected to vdd and the sources of the NMOS transistors 502 are connected to the corresponding drains of the NMOS transistors 504. The sources of the NMOS transistors 504 are connected to vss. This arrangement forms a series of inverters, which are connected through the loads to form the NMOS ring oscillator.

The NMOS transistors 502, 504, and 506 are compensatory in nature. That is, the NMOS transistors 502, 504 and 506 are used to compensate for the PVT variations in the logic modules 106 and 108. The NMOS ring oscillator generates the second digital signal. The second digital signal depends on the PVT variations in the NMOS transistors 502, 504, and 506.

Referring back to FIG. 4, the second counter 404 receives the second digital signal and the reference digital input signal as inputs, and generates the second calibration signal as an output. The second counter 404 counts the number of pulses of the second digital signal in the clock cycle of the reference digital input signal. An exemplary frequency of the second digital signal is about 400 MHz. The count is output as the second calibration signal denoted by caln[n:0]. The second calibration signal includes bits caln[0] to caln[n], where the number of bits generated by the counter is n+1, and n is an integer. In an exemplary embodiment of the present invention, the second counter 404 generates five bits corresponding to the count at an instant of time. The second calibration signal is provided to the logic modules 106 and 108 to compensate for the PVT variations.

Figure 6:
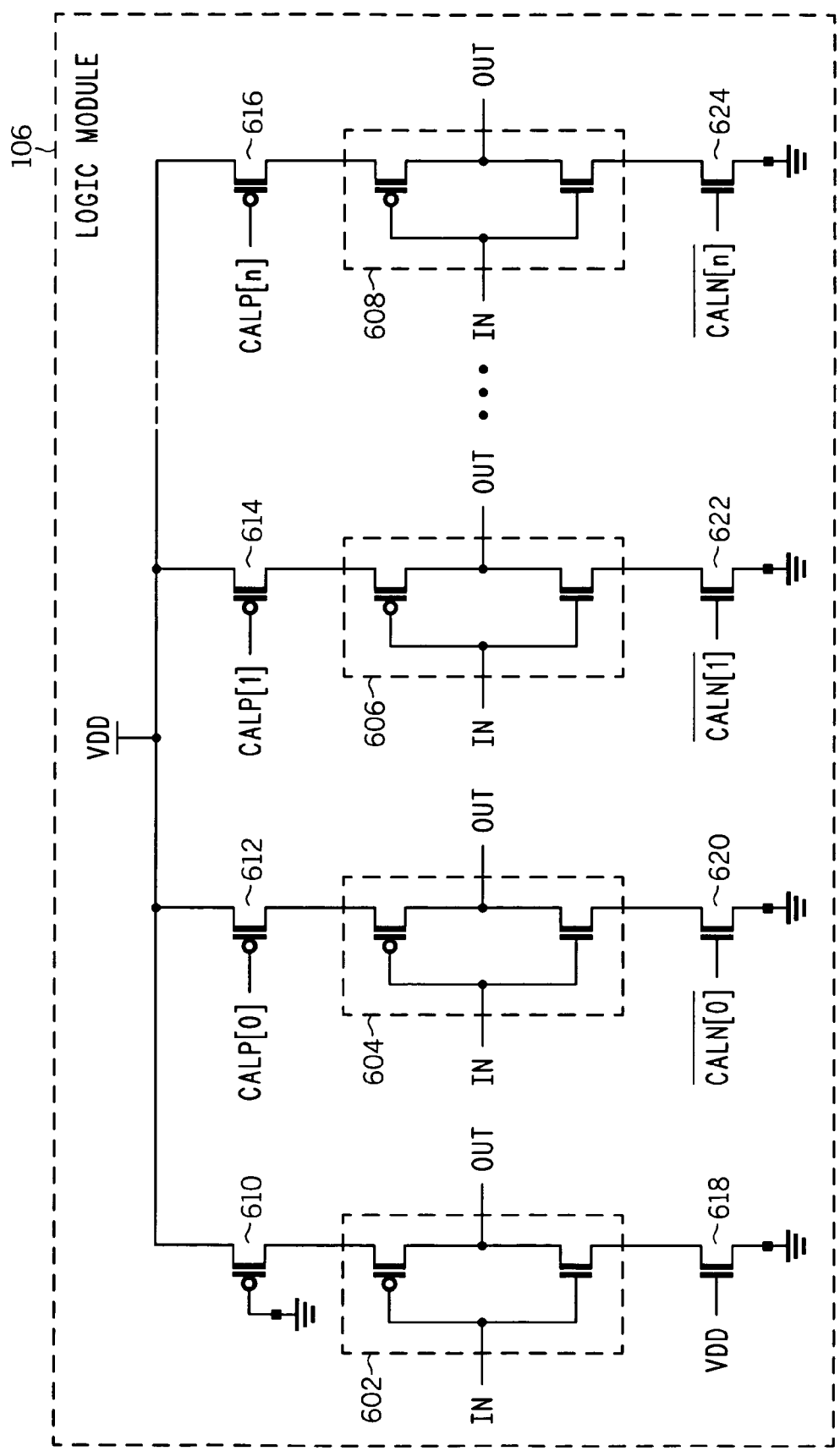
FIG. 6 is a circuit diagram of a logic module in accordance with an exemplary embodiment of the present invention.

FIG. 6 is a circuit diagram of the logic module 106 in accordance with an exemplary embodiment of the present invention. The logic module 106 includes inverters 602, 604, 606, and 608; PMOS transistors 610, 612, 614, and 616; and NMOS transistors 618, 620, 622, and 624. In an exemplary embodiment of the present invention, the gates of the PMOS transistor 610 and the NMOS transistor 618 are connected to ground and vdd respectively, to provide an offset to the logic module 106. The first calibration signal is applied at the gates of the PMOS transistors 612, 614, and 616. For example, the bit calp[0] is applied at the gate of the PMOS transistor 612, and the bit calp[n] is applied at the gate of the PMOS transistor 616. The number of bits in the calibration signal calp[n:0], is n+1, which preferably is equal to the number of inverters to be compensated for in the logic module 106.

The second calibration signal is inverted and applied at the gates of the NMOS transistors 620, 622, and 624. For example, the bit caln[0] is inverted, and then applied at the gate of the NMOS transistor 620. The bit caln[n] is inverted, and then applied at the gate of the NMOS transistor 624. The number of bits in the calibration signal caln[n:0] is n+1, which preferably is equal to the number of inverters to be compensated for in the logic module 106. Therefore, the outputs of the invertors 604, 606, and 608 depend on the switching of the PMOS transistors 612, 614, and 616 and the NMOS transistors 620, 622, and 624 based on the first calibration signal and the second calibration signal respectively. Similarly, the PVT variations in the logic module 108 are compensated for by providing the first calibration signal and the second calibration signal to the logic module 108.

Figure 7:
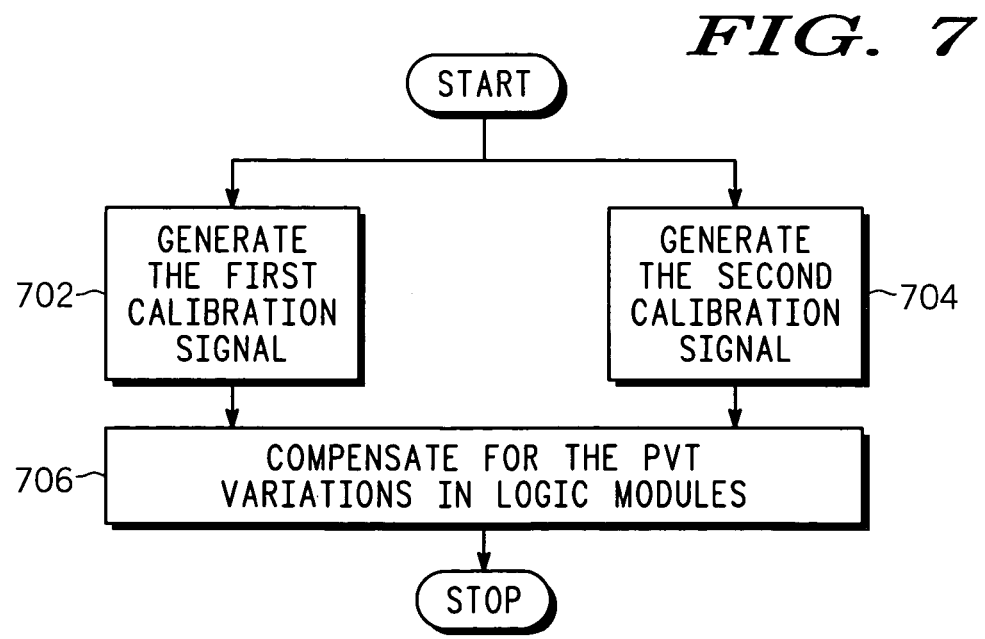
FIG. 7 is a flowchart of a method for compensating for PVT variations in an integrated circuit in accordance with an embodiment of the present invention.

FIG. 7 is a flowchart of a method for compensating for PVT variations in the IC in accordance with an embodiment of the present invention. The first calibration signal is generated at step 702 using the PMOS transistors 302, 304, and 306. At step 704, the second calibration signal is generated using the NMOS transistors 502, 504, and 506. In various embodiments of the present invention, step 702 and 704 are executed in parallel or substantially simultaneously. At step 706, the first calibration signal and the second calibration signal compensate for the PVT variations in the logic modules as described earlier.

Figure 8:
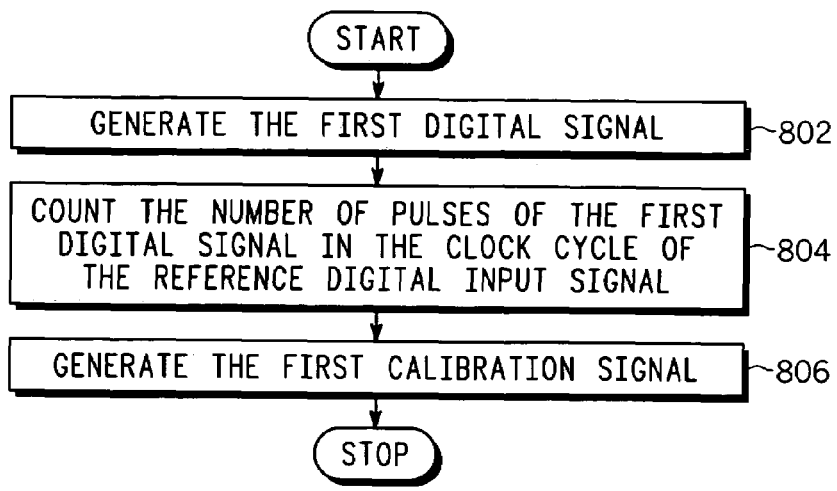
FIG. 8 is a flowchart depicting a method for generating a first calibration signal in accordance with an embodiment of the present invention.

FIG. 8 is a flowchart depicting a method for generating the first calibration signal in accordance with an embodiment of the present invention. The first digital signal is generated using the PMOS transistors 302, 304, and 306 at step 802. At step 804, the number of pulses of the first digital signal in the clock cycle of the reference digital input signal is counted. At step 806, the first calibration signal is generated based on the count generated at step 804.

Figure 9:
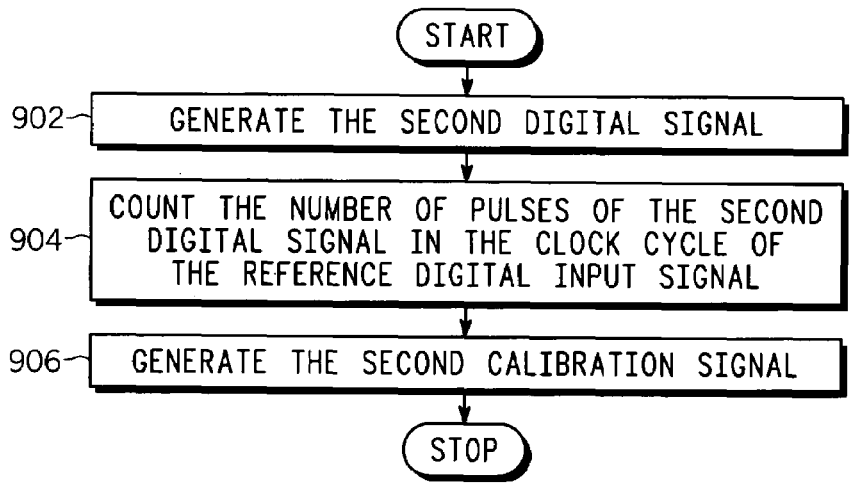
FIG. 9 is a flowchart depicting a method for generating a second calibration signal in accordance with an embodiment of the present invention.

FIG. 9 is a flowchart depicting a method for generating the second calibration signal in accordance with an embodiment of the present invention. The second digital signal is generated using the NMOS transistors 502, 504, and 506 at step 902. At step 904, the number of pulses of the second digital signal in the clock cycle of the reference digital input signal is counted. At step 906, the second calibration signal is generated based on the count generated at step 904.

Figure 10:
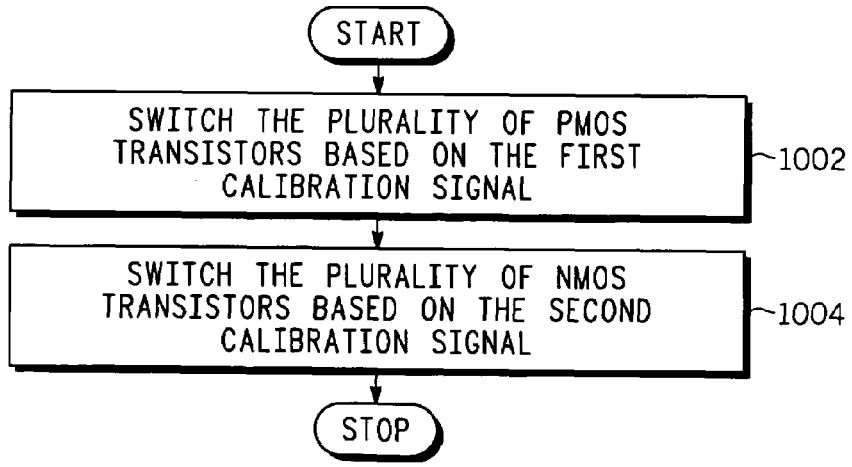
FIG. 10 is a flowchart depicting a method for compensating for PVT variations in logic modules in accordance with an embodiment of the present invention.

FIG. 10 is a flowchart depicting a method for compensating for the PVT variations in the logic modules in accordance with an embodiment of the present invention. The method will now be explained for the logic module 106. At step 1002, the PMOS transistors 612, 614, and 616 in the logic module 106 are switched 'ON' and 'OFF'. The switching of the PMOS transistors is based on the first calibration signal. At step 1004, the NMOS transistors 620, 622, and 624 in the logic module 106 are switched ON and OFF. The switching of the NMOS transistors is based on the second calibration signal. The variations in the logic module 108 are compensated for the PVT variations in a similar manner. In various embodiments of the present invention, steps 1002 and 1004 are executed in parallel. The first calibration signal and the second calibration signal are provided to the logic modules to compensate for the PVT variations.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A compensation circuit for compensating for process, voltage and temperature (PVT) variations in an integrated circuit, the integrated circuit including a plurality of logic modules, the plurality of logic modules including a plurality of P-type metal oxide semiconductor (PMOS) transistors and a plurality of N-type metal oxide semiconductor (NMOS) transistors, the compensation circuit comprising:
   a first frequency generator including a set of PMOS transistors for generating a first digital signal;
   a first counter coupled to the first frequency generator for counting a number of pulses of the first digital signal in a clock cycle of a reference digital input signal, and generating a first calibration signal, wherein the first calibration signal is used to compensate for the PVT variations in the plurality of PMOS transistors; and
   a second functional module including a set of NMOS transistors for generating a second calibration signal, wherein the second calibration signal is used to compensate for the PVT variations in the plurality of NMOS transistors.

2. The compensation circuit of claim 1, wherein the first frequency generator is a PMOS ring oscillator.

3. The compensation circuit of claim 1, wherein the first digital signal depends on PVT variations in the set of PMOS transistors.

4. The compensation circuit of claim 1, wherein the second functional module comprises:
   a second frequency generator for generating a second digital signal, wherein the second digital signal is generated by the set of NMOS transistors; and
   a second counter coupled to the second frequency generator for counting number of pulses of the second digital signal in a clock cycle of a reference digital input signal, and generating the second calibration signal.

5. The compensation circuit of claim 4, wherein the second frequency generator is an NMOS ring oscillator.

6. The compensation circuit of claim 4, wherein the second digital signal depends on PVT variations in the set of NMOS transistors.

7. The compensation circuit of claim 1, wherein the plurality of logic modules is one of a plurality of I/O drivers, a plurality of ring oscillators, a plurality of delay lines, a plurality of universal serial bus transmitters, a plurality of a serial advanced technology attachment transmitters, and a plurality of low voltage differential signaling transmitters.

8. A compensation circuit for compensating for process, voltage and temperature (PVT) variations in an integrated circuit, the integrated circuit including a plurality of logic modules, the plurality of logic modules including a plurality of P-type metal oxide semiconductor (PMOS) transistors, and a plurality of N-type metal oxide semiconductor (NMOS) transistors, the compensation circuit comprising:
   a first frequency generator including a set of PMOS transistors for generating a first digital signal;
   a first counter coupled to the first frequency generator for generating a first calibration signal based on the first digital signal, wherein the first calibration signal is used to compensate for the PVT variations in the plurality of PMOS transistors;
   a second frequency generator including a set of NMOS transistors for generating a second digital signal; and a second counter coupled to the second frequency generator for generating a second calibration signal based on the second digital signal, wherein the second calibration signal is used to compensate for the PVT variations in the plurality of NMOS transistors.

9. The compensation circuit of claim 8, wherein the first-calibration signal is generated by counting number of pulses of the first digital signal in a clock cycle of a reference digital input signal.

10. The compensation circuit of claim 8, wherein the second calibration signal is generated by counting number of pulses of the second digital signal in a clock cycle of a reference digital input signal.

11. A method for compensating for process, voltage and temperature (PVT) variations in an integrated circuit, the integrated circuit including a plurality of logic modules, the plurality of logic modules including a plurality of P-type metal oxide semiconductor (PMOS) transistors and a plurality of N-type metal oxide semiconductor (NMOS) transistors, the method comprising:
  generating a first digital signal using the set of PMOS transistors;
  counting number of pulses of the first digital signal in a clock cycle of a reference digital input signal to generate a first calibration signal;
  generating a second calibration signal using a set of NMOS transistors; and
  compensating for the PVT variations in the plurality of logic modules by providing the first calibration signal to the plurality of PMOS transistors, and the second calibration signal to the plurality of NMOS transistors.

12. The PVT compensation method of claim 11, further comprising:
  compensating for the PVT variations at skewed corners associated with the plurality of PMOS transistors and the plurality of NMOS transistors.

13. The PVT compensation method of claim 11, wherein the first digital signal depends on PVT variations in the set of PMOS transistors.

14. The PVT compensation method of claim 11, wherein generating the second calibration signal comprises:
  generating a second digital signal using the set of NMOS transistors; and
  counting number of pulses of the second digital signal in a clock cycle of a reference digital input signal to generate the second calibration signal.

15. The PVT compensation method of claim 14, wherein the second digital signal depends on PVT variations in the set of NMOS transistors.

16. The PVT compensation method of claim 11, wherein compensating for the PVT variations in the plurality of logic modules comprises:
  switching the plurality of PMOS transistors based on the first calibration signal; and
  switching the plurality of NMOS transistors based on the second calibration signal.

* * * * *